United States Patent
Shih (10) Patent No.: US 10,171,052 B2
(45) Date of Patent: Jan. 1, 2019

(54) OPERATIONAL AMPLIFIER AND DIFFERENTIAL AMPLIFYING CIRCUIT THEREOF

(71) Applicant: REALTEK SEMICONDUCTOR CORPORATION, Hsinchu (TW)

(72) Inventor: Kuan-Yu Shih, New Taipei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/818,547

(22) Filed: Nov. 20, 2017

(65) Prior Publication Data

US 2018/0152156 A1 May 31, 2018

(30) Foreign Application Priority Data

Nov. 29, 2016 (TW) .............................. 105139294 A (51) Int. Cl.
*H03F 3/45* (2006.01)
*H03F 1/02* (2006.01)

(52) U.S. Cl.
CPC ....... *H03F 3/45224* (2013.01); *H03F 1/0211* (2013.01); *H03F 3/4565* (2013.01); *H03F 3/45475* (2013.01); *H03F 3/45636* (2013.01); *H03F 3/45654* (2013.01); *H03F 2200/144* (2013.01); *H03F 2200/267* (2013.01); *H03F 2200/48* (2013.01); *H03F 2203/45031* (2013.01); *H03F 2203/45032* (2013.01); *H03F 2203/45151* (2013.01); *H03F 2203/45156* (2013.01); *H03F 2203/45276* (2013.01); *H03F 2203/45404* (2013.01);

(Continued)

(58) Field of Classification Search
CPC ............. H03F 3/45; H03F 2003/45008; H03F 2003/45022
USPC .................................................. 330/253, 258
See application file for complete search history.

(56) References Cited

U.S. PATENT DOCUMENTS 6,121,836 A * 9/2000 Vallencourt ......... H03F 3/45183
330/253

FOREIGN PATENT DOCUMENTS

CN 105099380 11/2015

OTHER PUBLICATIONS

English abstract translation of CN 105099380.
(Continued)

*Primary Examiner* — Steven J Mottola
(74) *Attorney, Agent, or Firm* — WPAT, PC (57) ABSTRACT

An operational amplifier and a differential amplifying circuit thereof. The differential amplifying circuit receives a differential input signal and outputs a differential output signal. The differential amplifying circuit includes an output port that has a first terminal and a second terminal, the differential output signal being outputted via the first and second terminals; a first transistor pair receiving the differential input signal via two first ends and coupling to the first and second terminals respectively via two second ends; a second transistor pair receiving the differential input signal via two first ends and coupling to the first and second terminals respectively via two second ends; and a third transistor pair receiving a control signal via two first ends and coupling to the first and second terminals respectively via two second ends. The control signal controls the third transistor pair to switch on or off and/or controls the current flowing therethrough.

12 Claims, 5 Drawing Sheets

(52) U.S. Cl.
CPC .............. *H03F 2203/45418* (2013.01); *H03F 2203/45424* (2013.01); *H03F 2203/45692* (2013.01)

(56) References Cited

OTHER PUBLICATIONS

Zhang et al., Design of Ultra-Low Power Biopotential Amplifiers for Biosignal Acquisition Applications, IEE transactions on biomedical circuits and systems, Aug. 2012, pp. 344-355, vol. 6 No. 4.

* cited by examiner

OPERATIONAL AMPLIFIER AND DIFFERENTIAL AMPLIFYING CIRCUIT THEREOF

BACKGROUND OF THE INVENTION

1. Field of the Invention

The present invention generally relates to an operational amplifier, and, more particularly, to a deadlock-free operational amplifier and a deadlock-free differential amplifying circuit thereof.

2. Description of Related Art

Figure 1:
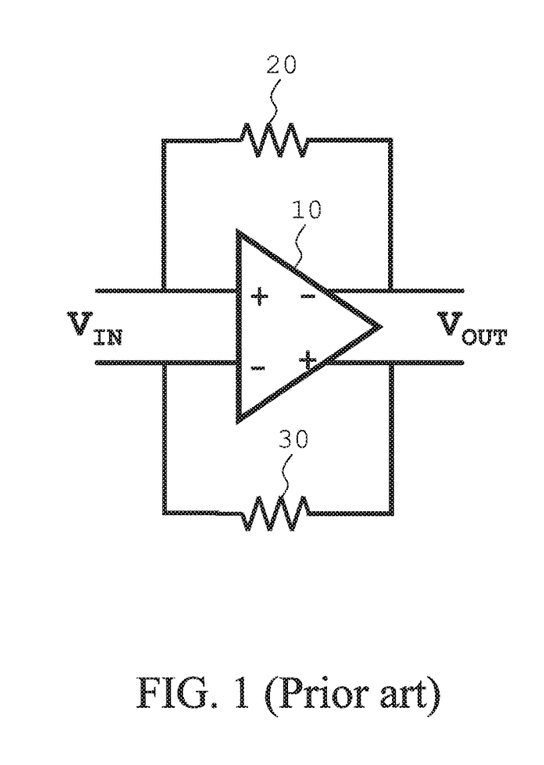
FIG. 1 illustrates a circuit that applies a fully differential operational amplifier.

FIG. 1 shows a circuit that applies a fully differential operational amplifier. A differential input pair and a differential output pair of a fully differential operational amplifier 10 are coupled to each other through two feedback resistors 20 and 30. Deadlock prevention in a common mode, as well as a high gain, is important to the design of the fully differential operational amplifier 10. If the fully differential operational amplifier 10 is not properly designed, deadlock may occur when the differential input signal $V_{In}$ (inputted via the differential input pair) and the differential output signal $V_{OUT}$ (outputted via the differential output pair) are simultaneously at a high electric potential or a low electric potential. In light of the foregoing, there exists a need for a fully differential operational amplifier that prevents deadlock and has a high gain.

SUMMARY OF THE INVENTION

In view of the issues of the prior art, an object of this invention is to provide an operational amplifier and a differential amplifying circuit thereof that can prevent deadlock and has a high gain, so as to make an improvement to the prior art.

According to an aspect of this invention, an operational amplifier is disclosed. The operational amplifier has a differential input pair and a differential output pair, and includes an output stage amplifying circuit a first transistor pair, a second transistor pair, a first current source, a second current source, a third transistor pair, and a control circuit. The output stage amplifying circuit uses a first terminal and a second terminal as an input port thereof and uses the differential output pair as an output port thereof. The first transistor pair includes a first transistor and a second transistor. A first end of the first transistor and a first end of the second transistor are respectively coupled to a first input end and a second input end of the differential input pair, and a second end of the first transistor and a second end of the second transistor are respectively coupled to the first terminal and the second terminal. The second transistor pair includes a third transistor and a fourth transistor. A first end of the third transistor and a first end of the fourth transistor are respectively coupled to the first input end and the second input end of the differential input pair, and a second end of the third transistor and a second end of the fourth transistor are respectively coupled to the first terminal and the second terminal. The first current source is coupled to the first terminal. The second current source is coupled to the second terminal. The third transistor pair includes a fifth transistor and a sixth transistor. A first end of the fifth transistor and a first end of the sixth transistor respectively receive a control signal, and a second end of the fifth transistor and a second end of the sixth transistor are respectively coupled to the first terminal and the second terminal. The control circuit is coupled to the differential output pair and operable to generate the control signal according to voltages of the differential output pair and a common mode voltage.

According to another aspect of this invention, a differential amplifying circuit is disclosed. The differential amplifying circuit receives a differential input signal and outputs a differential output signal. The differential amplifying circuit includes an output port, a first transistor pair, a second transistor pair, and a third transistor pair. The output port has a first terminal and a second terminal. The differential output signal is outputted via the first terminal and the second terminal. The first transistor pair includes a first transistor and a second transistor. A first end of the first transistor and a first end of the second transistor receive the differential input signal, and a second end of the first transistor and a second end of the second transistor are respectively coupled to the first terminal and the second terminal. The second transistor pair includes a third transistor and a fourth transistor. A first end of the third transistor and a first end of the fourth transistor receive the differential input signal, and a second end of the third transistor and a second end of the fourth transistor are respectively coupled to the first terminal and the second terminal. The third transistor pair includes a fifth transistor and a sixth transistor. A first end of the fifth transistor and a first end of the sixth transistor respectively receive a control signal, and a second end of the fifth transistor and a second end of the sixth transistor are respectively coupled to the first terminal and the second terminal. The control signal controls the fifth transistor and the sixth transistor to turn on or off and/or controls the electric currents flowing therethrough.

The present invention discloses an operational amplifier and a differential amplifying circuit thereof that can prevent deadlock and has a high gain. In comparison with the prior art, the operational amplifier and its differential amplifying circuit of this invention can effectively prevent deadlock with simple circuits.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 2:
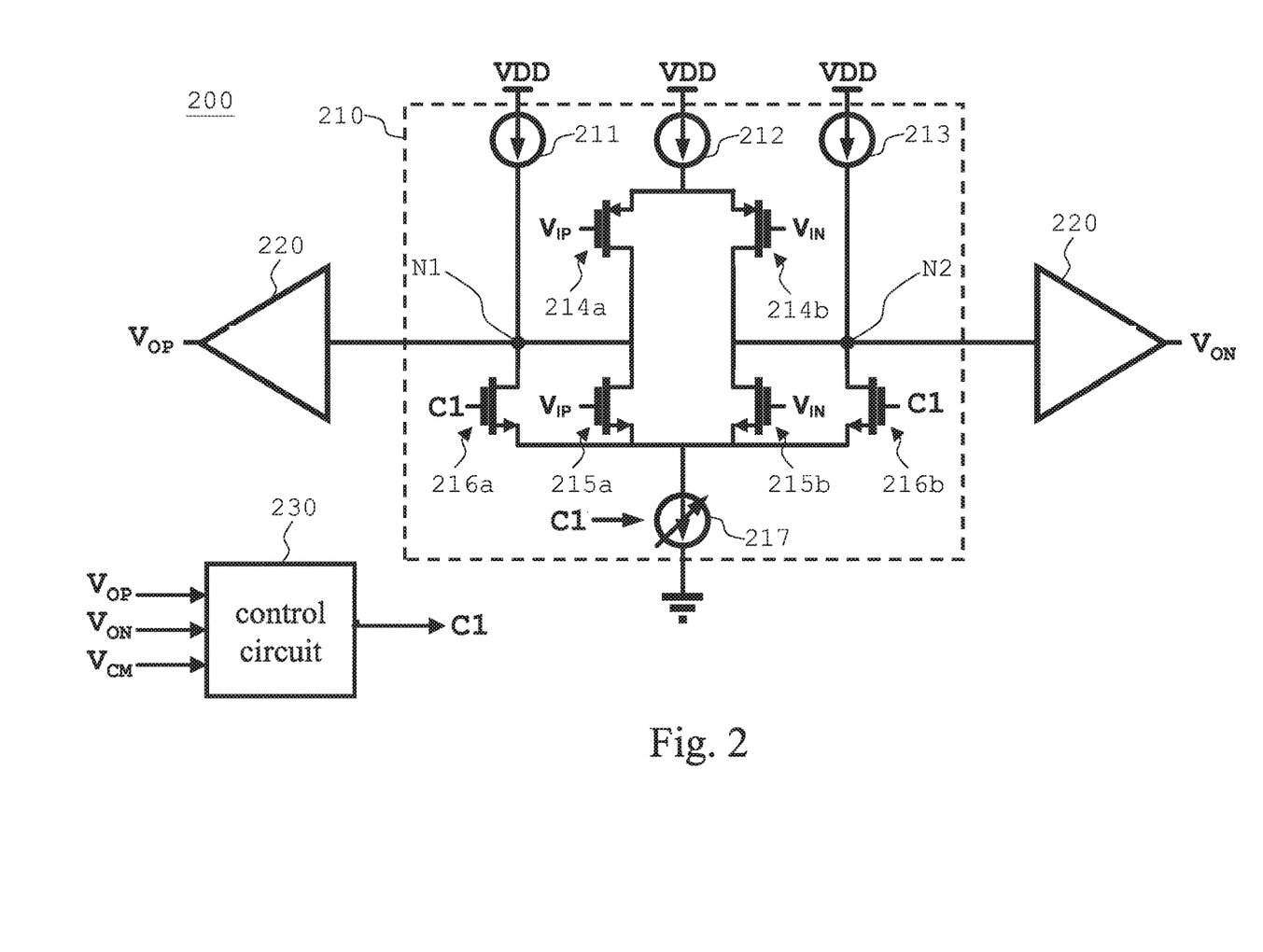
FIG. 2 illustrates a schematic diagram of an operational amplifier according to an embodiment of the present invention.

FIG. 2 illustrates a schematic diagram of an operational amplifier according to an embodiment of the present invention. An operational amplifier 200 includes a first-stage amplifying circuit 210, a second-stage amplifying circuit 220 and a control circuit 230. The first-stage amplifying circuit 210 mainly includes three transistor pairs; the first, second and third transistor pairs are respectively made up of transistors (214a, 214b), (215a, 215b) and (216a, 216b). The first and second transistor pairs are respectively biased by a current source 212 and a current source 217. The first and second transistor pairs have their respective control ends (taking a metal-oxide-semiconductor field-effect transistor (MOSFET) for example, a control end of a transistor is the gate thereof) coupled to a differential input pair of the operational amplifier 200; more specifically, the first transistor pair receives a differential input signal ($V_{IN}$ and $V_{IP}$), and the second transistor pair also receives the differential input signal. The differential input signal is amplified by the first-stage amplifying circuit 210 before being inputted to the second-stage amplifying circuit 220 via the terminals N1 and N2, and is then amplified again by the second-stage amplifying circuit 220 to become a differential output signal ($V_{ON}$ and $V_{OP}$) that is outputted via a differential output pair of the operational amplifier 200. The first and second transistor pairs are connected in parallel to provide even greater transconductance, such that the first-stage amplifying circuit 210 has a greater gain. The second-stage amplifying circuit 220 may include one or more than one stage of amplifying circuits that are made up of transistors and other components, and thus the second-stage amplifying circuit 220 can be regarded as an output stage amplifying circuit of the operational amplifier 200. Since people having ordinary skill in the art can appreciate various modifications to the second-stage amplifying circuit 220, the detailed description shall be omitted herein for brevity. Since the first-stage amplifying circuit 210 amplifies differential signals to generate amplified differential signals outputted at its output port formed by terminals N1 and N2, the first-stage amplifying circuit 210 can be regarded as a differential amplifying circuit. The terminals N1 and N2 can be regarded as an input port of the second-stage amplifying circuit 220, and the differential output pair of the operational amplifier 200 can be regarded as the output port of the second-stage amplifying circuit 220.

One of the purposes of the third transistor pair is to adjust the electric potentials of terminals N1 and N2. Transistors 216a and 216b have their respective first ends receiving the control signal C1, their respective second ends coupled to the terminals N1 or N2, and their respective third ends coupled to a reference potential (e.g., ground) through the current source 217. The control circuit 230 generates a control signal C1 based on the voltages of the differential output pair (i.e., the differential output signals $V_{ON}$ and $V_{OP}$) of the operational amplifier 200 and a common mode voltage $V_{CM}$.

When the differential input signal and the differential output signal are both at a low potential (one of the deadlock states, where the common mode differential input signal causes the second transistor pair to turn off), an average voltage of the differential output signal (($V_{ON}+V_{OP}$)/2) is substantially smaller than the voltage of the common mode signal $V_{CM}$. Accordingly, the control circuit 230 generates the control signal C1 according to the voltages of the differential output signal and the common mode signal $V_{CM}$ to control the third transistor pair to turn on, which in turn pulls down the electric potentials of the terminals N1 and N2 so that the operational amplifier 200 can leave the deadlock state. In detail, as shown in FIG. 2, in one case where the third transistor pair is implemented with n-type metal-oxide-semiconductor field-effect-transistors (nMOSFETs), when the average voltage of the differential output signal is smaller than the voltage of the common mode signal $V_{CM}$, the control circuit 230 increases the voltage of the control signal C1 so that the third transistor pair turns on or increases the current flowing therethrough, thereby reducing the electric potentials of the terminals N1 and N2. As a result, as the electric potentials the of terminals N1 and N2 decrease, the electric potential of the common mode differential output signal rises (because typically the second-stage amplifying circuit 220 causes a phase of the common mode signal to be opposite), and the operational amplifier 200 can thus leave the deadlock state. In addition to controlling the third transistor pair, the control signal C1 may simultaneously control the magnitude of the current of the current source 217. When the current of the current source 217 increases, the electric potentials of the terminals N1 and N2 can be accurately controlled.

In another case where the differential input signal and the differential output signal are both at a high electric potential (the other deadlock state where the terminals N1 and N2 are at a low electric potential), the first-stage amplifying circuit 210 provides currents at the terminals N1 and N2 respectively through a current source 211 and a current source 213 to raise the electric potentials of the terminals N1 and N2, thereby causing the operational amplifier 200 to leave the deadlock state.

Figure 3:
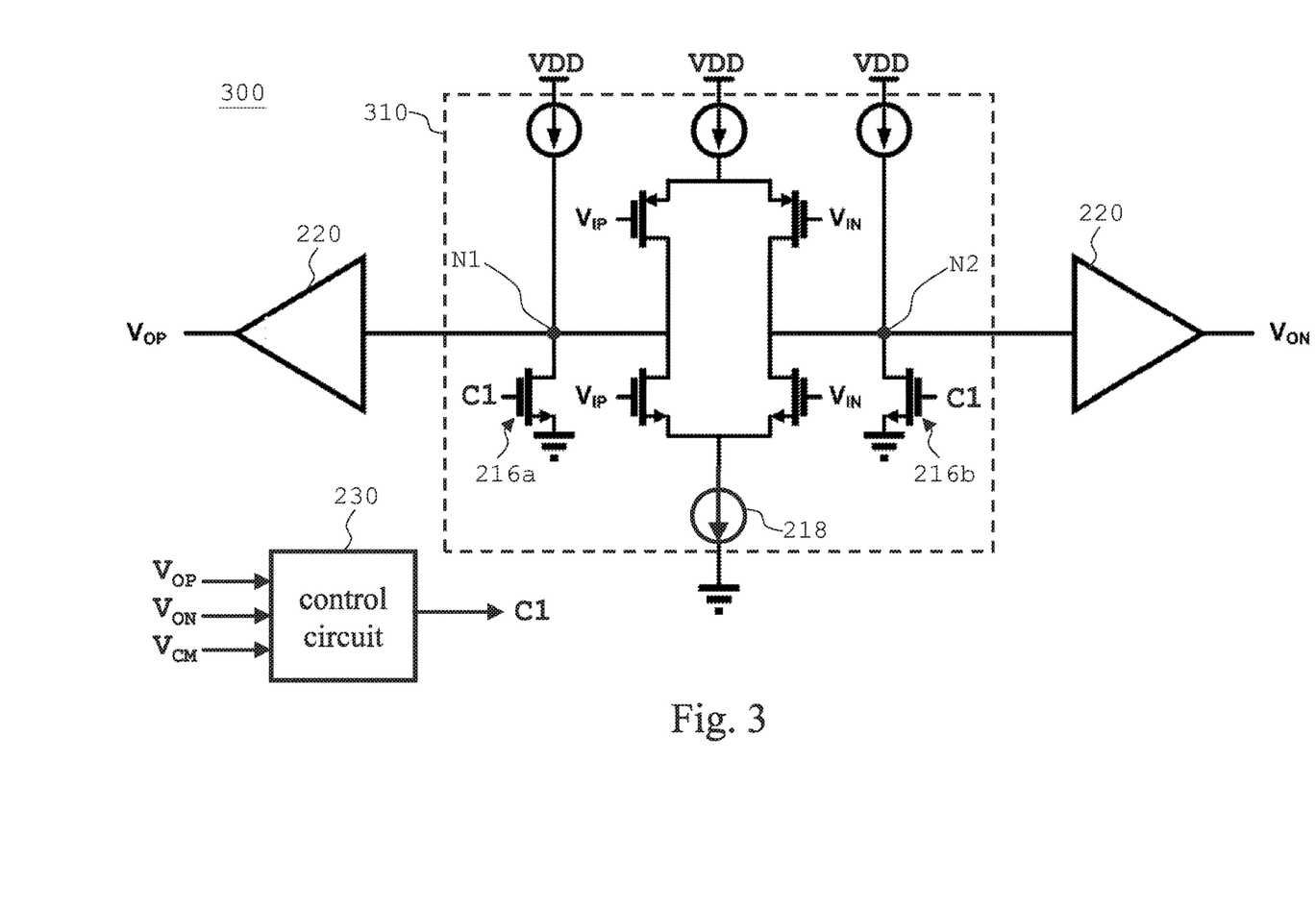
FIG. 3 illustrates a circuit diagram of an operational amplifier according to another embodiment of the present invention.

FIG. 3 is a circuit diagram of an operational amplifier according to another embodiment of the present invention. An operational amplifier 300 includes a first-stage amplifying circuit 310, the second-stage amplifying circuit 220, and the control circuit 230. The first-stage amplifying circuit 310 is similar to the first-stage amplifying circuit 210, except that the third transistor pair of the first-stage amplifying circuit 310 (the transistors 216a and 216b) is not coupled to the reference potential (e.g., ground) through a current source 218, but is directly coupled to the reference potential as shown in the figure. Alternatively, in other embodiments the third transistor pair may be coupled to the reference potential through other components (including but not limited to resistors). When the third transistor pair is turned on, the electric potentials of the terminals N1 and N2 can be pulled down to the reference potential.

Figure 4:
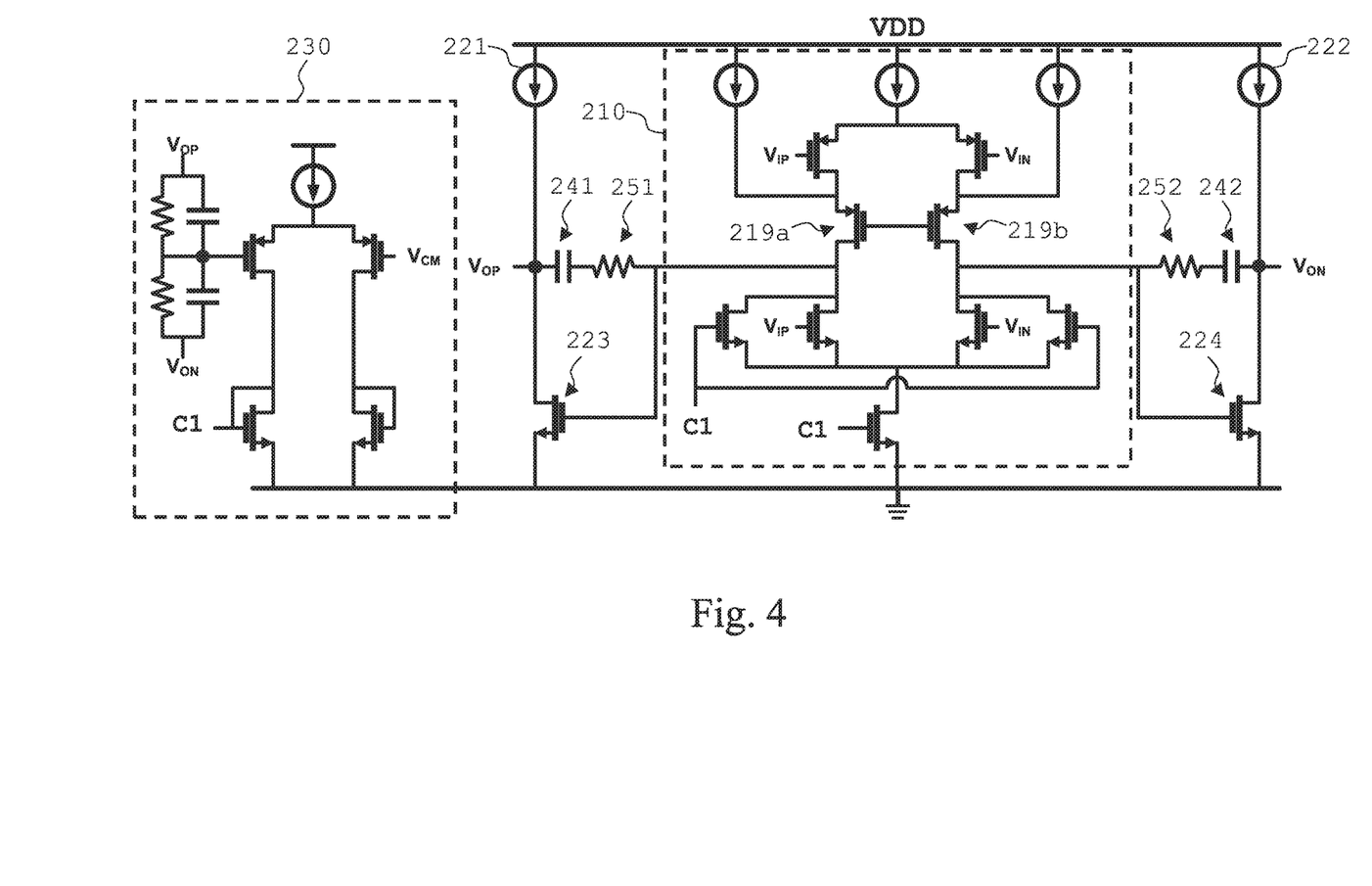
FIG. 4 illustrates a detailed circuit diagram of the operational amplifier of FIG. 2 according to one embodiment of the present invention.
Figure 5:
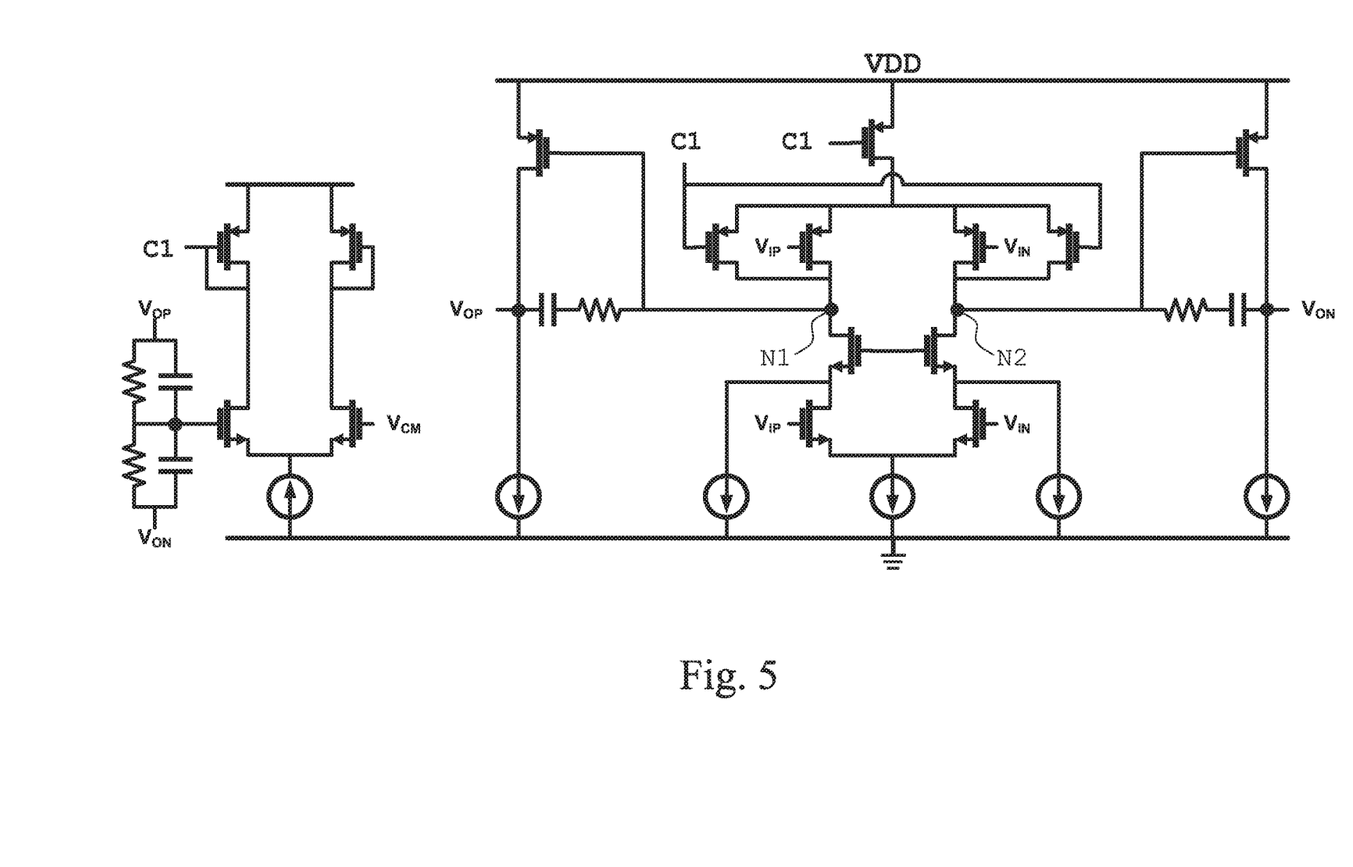
FIG. 5 illustrates a detailed circuit diagram of the operational amplifier of FIG. 2 according to another embodiment of this invention.

FIG. 4 is a detailed circuit diagram of the operational amplifier of FIG. 2 according to one embodiment of the present invention. The second-stage amplifying circuit 220 is made up of current sources 221 and 222 and transistors 223 and 224. The control circuit 230 compares the average voltage of the differential output signals ($V_{ON}$ and $V_{OP}$) with the voltage of the common mode signal $V_{CM}$. When the average voltage of the differential output signal is smaller than the voltage of the common mode signal $V_{CM}$, the control signal C1 has a higher voltage. One of the purposes of the transistors 219a and 219b is to increase the output impedance of the first-stage amplifying circuit 210, and the transistors 219a and 219b are not essential to this embodiment. One of the functions of the capacitor 241 (or 242) and the resistor 251 (or 252) is to implement frequency compensation between the first-stage amplifying circuit 210 and the second-stage amplifying circuit 220. The capacitor 241 (or 242) and the resistor 251 (or 252) are not essential to this embodiment or can be implemented in other manners. FIG. 5 is a detailed circuit diagram of the operational amplifier of FIG. 2 according to another embodiment of this invention. Compared with FIG. 4, the nMOSFETs and p-type metal-oxide-semiconductor field-effect-transistors (pMOSFETs) in FIG. 4 are respectively replaced by pMOSFETs and nMOSFETs in FIG. 5. The connections among these components and the operations of these components are well known to those skilled in the art and the detailed descriptions thereof shall be omitted herein for brevity. In the embodiment of FIG. 5, the transistors corresponding to the third transistor pair of FIG. 2 are implemented with pMOSFETs, and when the average voltage of the differential output signal is greater than the voltage of the common mode signal $V_{CM}$, the control circuit 230 correspondingly decreases the voltage of the control signal C1 to cause the transistors corresponding to the third transistor pair of FIG. 2 to turn on or to increase the current flowing therethrough, thereby increasing the electric potentials of the terminals N1 and N2 so that the operational amplifier 200 leaves the deadlock state.

Please note that the shape, size, and ratio of any element in the disclosed figures are exemplary for understanding, not for limiting the scope of this invention. Although the transistors in the embodiments of FIGS. 2 to 5 are implemented with MOSFETs, they can be implemented with bipolar junction transistors (BJTs) or other transistors in different embodiments. Further, this invention can be applied to various types of operational amplifiers.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An operational amplifier, having a differential input pair and a differential output pair, comprising:
   an output stage amplifying circuit, using a first terminal and a second terminal as an input port thereof and using said differential output pair as an output port thereof;
   a first transistor pair, comprising a first transistor and a second transistor, wherein a first end of said first transistor and a first end of said second transistor are respectively coupled to a first input end and a second input end of said differential input pair, and a second end of said first transistor and a second end of said second transistor are respectively coupled to said first terminal and said second terminal;
   a second transistor pair, comprising a third transistor and a fourth transistor, wherein a first end of said third transistor and a first end of said fourth transistor are respectively coupled to said first input end and said second input end of said differential input pair, and a second end of said third transistor and a second end of said fourth transistor are respectively coupled to said first terminal and said second terminal;
   a first current source, coupled to said first terminal;
   a second current source, coupled to said second terminal;
   a third transistor pair, comprising a fifth transistor and a sixth transistor, wherein a first end of said fifth transistor and a first end of said sixth transistor respectively receive a control signal, and a second end of said fifth transistor and a second end of said sixth transistor are respectively coupled to said first terminal and said second terminal; and
   a control circuit, coupled to said differential output pair, for generating said control signal according to voltages of said differential output pair and a common mode voltage.

2. The operational amplifier of claim 1, wherein said operational amplifier receives a differential input signal through said differential input pair and outputs a differential output signal through said differential output pair, said fifth transistor and said sixth transistor are nMOSFETs, and when an average of said differential output signal is substantially smaller than said common mode voltage, said control circuit increases a voltage of said control signal to increase the electric current flowing through said third transistor pair, so as to reduce the electric potentials of said first terminal and said second terminal.

3. The operational amplifier of claim 1, wherein said operational amplifier receives a differential input signal through said differential input pair and outputs a differential output signal through said differential output pair, said fifth transistor and said sixth transistor are pMOSFETs, and when an average of said differential output signal is substantially greater than said common mode voltage, said control circuit decreases a voltage of said control signal to increase the electric current flowing through said third transistor pair, so as to increase the electric potentials of said first terminal and said second terminal.

4. The operational amplifier of claim 1 further comprising:
   a third current source;
   wherein, a third end of said third transistor and a third end of said fourth transistor are coupled to a reference voltage through said third current source, and a third end of said fifth transistor and a third end of said sixth transistor are coupled to said reference voltage through said third current source.

5. The operational amplifier of claim 4, wherein a magnitude of an electric current of said third current source is controlled by said control signal.

6. The operational amplifier of claim 1 further comprising:
   a third current source;
   wherein, a third end of said third transistor and a third end of said fourth transistor are coupled to a reference voltage through said third current source, a third end of said fifth transistor and a third end of said sixth transistor are coupled to said reference voltage, and said third current source is not coupled between said reference voltage and said third ends of said fifth transistor and said sixth transistor.

7. A differential amplifying circuit, receiving a differential input signal and outputting a differential output signal, comprising:
   an output port, having a first terminal and a second terminal, wherein said differential output signal is outputted via said first terminal and said second terminal;
   a first transistor pair, comprising a first transistor and a second transistor, wherein a first end of said first transistor and a first end of said second transistor receive said differential input signal, and a second end of said first transistor and a second end of said second transistor are respectively coupled to said first terminal and said second terminal;
   a second transistor pair, comprising a third transistor and a fourth transistor, wherein a first end of said third transistor and a first end of said fourth transistor receive said differential input signal, and a second end of said third transistor and a second end of said fourth transistor are respectively coupled to said first terminal and said second terminal; and a third transistor pair, comprising a fifth transistor and a sixth transistor, wherein a first end of said fifth transistor and a first end of said sixth transistor respectively receive a control signal, and a second end of said fifth transistor and a second end of said sixth transistor are respectively coupled to said first terminal and said second terminal;

wherein, said control signal controls said fifth transistor and said sixth transistor to turn on or off and/or controls the electric currents flowing therethrough.

8. The differential amplifying circuit of claim 7, wherein said fifth transistor and said sixth transistor are nMOSFETs, and when an average of said differential output signal is substantially smaller than a common mode voltage, said control signal causes the electric currents flowing through said third transistor pair to increase, so as to decrease the electric potentials of said first terminal and said second terminal.

9. The differential amplifying circuit of claim 7, wherein said fifth transistor and said sixth transistor are pMOSFETs, and when an average of said differential output signal is substantially greater than a common mode voltage, said control signal causes the electric currents flowing through said third transistor pair to increase, so as to increase the electric potentials of said first terminal and said second terminal.

10. The differential amplifying circuit of claim 7 further comprising:

a current source;

wherein, a third end of said third transistor and a third end of said fourth transistor are coupled to a reference voltage through said current source, and a third end of said fifth transistor and a third end of said sixth transistor are coupled to said reference voltage through said current source.

11. The differential amplifying circuit of claim 10, wherein a magnitude of the electric current of said current source is controlled by said control signal.

12. The differential amplifying circuit of claim 7 further comprising:

a current source;

wherein, a third end of said third transistor and a third end of said fourth transistor are coupled to a reference voltage through said current source, a third end of said fifth transistor and a third end of said sixth transistor are coupled to said reference voltage, and said current source is not coupled between said reference voltage and said third ends of said fifth transistor and said sixth transistor.

* * * * *